United States Patent
Toda (10) Patent No.: US 6,178,518 B1
(45) Date of Patent: Jan. 23, 2001

(54) SEMICONDUCTOR MEMORY SYSTEM COMPRISING SYNCHRONOUS DRAM AND CONTROLLER

(75) Inventor: Haruki Toda, Yokohama (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/165,692

(22) Filed: Oct. 2, 1998

(30) Foreign Application Priority Data

Oct. 2, 1997 (JP) .................................................. 9-269779

(51) Int. Cl.⁷ ........................................................ G06F 1/04
(52) U.S. Cl. ............................................. 713/600; 709/400
(58) Field of Search ................................. 713/600; 710/1; 714/798; 709/1, 400; 711/167, 100

(56) References Cited

U.S. PATENT DOCUMENTS

| | | | |
|---|---|---|---|
| 4,339,819 | * | 7/1982 | Jacobson . |
| 5,353,433 | * | 10/1994 | Sherman ............................ 713/600 |
| 5,448,715 | * | 9/1995 | Lelm et al. .......................... 713/600 |
| 5,758,056 | * | 5/1998 | Barr ......................................... 714/7 |
| 5,909,563 | * | 6/1999 | Jacobs ................................... 710/129 |
| 5,941,447 | * | 8/1999 | Chu et al. ....................... 228/180.21 |

FOREIGN PATENT DOCUMENTS 1069326   3/1998  (JP) .................................. G06F/1/10

* cited by examiner

Primary Examiner—Robert W. Beausoliel, Jr.
Assistant Examiner—Rita A Ziemer
(74) Attorney, Agent, or Firm—Hogan & Hartson, LLP (57) ABSTRACT

A maximum flight time measuring circuit constituted by a first delay circuit for delaying a system clock and controlling its delay time in accordance with a strobe clock from DIMMs and a delayline register circuit for storing a delayed state in the delay circuit, and a second delay circuit are provided. Contents of the delayline register circuit are input to the second delay circuit, which is controlled to generate the same delay as that of the first delay circuit. The output of the second delay circuit is supplied as a data fetch signal to a control buffer for receiving read data DQ from the DIMMs.

21 Claims, 9 Drawing Sheets

SEMICONDUCTOR MEMORY SYSTEM COMPRISING SYNCHRONOUS DRAM AND CONTROLLER

BACKGROUND OF THE INVENTION

The present invention relates to a semiconductor memory system for transmitting data on a board on which a synchronous DRAM (SDRAM) and its controller are mounted, and more particularly to a semiconductor memory system that can realize high-speed synchronization type data transmission with reliability.

Figure 1:
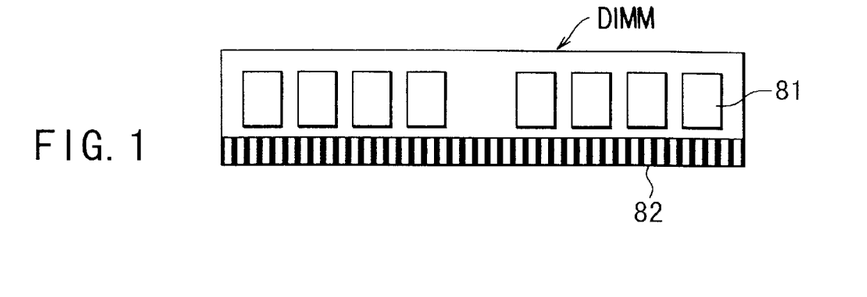
FIG. 1 is a plan view illustrating a general structure of a DIMM.

Generally, a semiconductor memory is used as a DIMM (Dual Inline Memory Module) when it is mounted in a personal computer, etc. FIG. 1 is a plan view illustrating a general DIMM. On the DIMM, eight or sixteen memory chips 81 are mounted to input or output the data and signals via terminals 82 formed on both sides of a substrate.

A memory board in a personal computer, etc. generally comprises four sockets and a controller for controlling four DIMMs so that these DIMMs can be mounted on the memory board.

Figure 2:
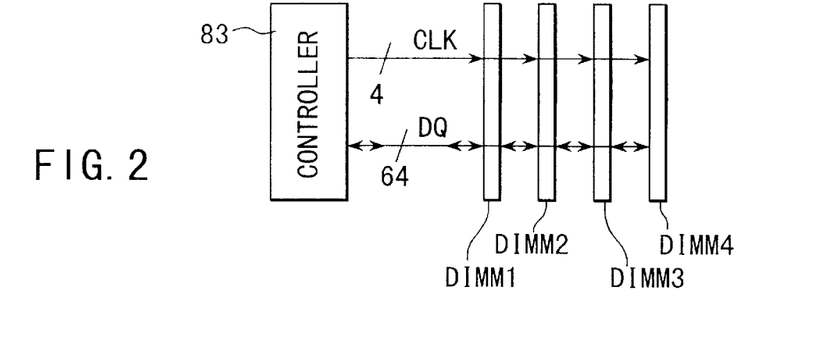
FIG. 2 is a block diagram illustrating a concept of a conventional memory board on which a controller and DIMMs are mounted.

FIG. 2 is a diagram illustrating a concept of the memory board on which a controller 83 and four DIMMs are mounted. The controller 83 transmits four common clocks CLK synchronizing and controlling memory chips on the four DIMMs (DIMM1 to DIMM4) to each of the DIMMs. Each of the DIMMs transmits 64-bit data DQ to the controller 83 via a common data bus.

In the semiconductor memory system comprising the controller and DIMMs, the problem is the timing at which the controller fetches the data from the DIMMs. Since the distances between the controller and the respective DIMMs are different, the flight times of the clock CLK and the data DQ are also different. For this reason, the fetch timing of the data is different, depending on the DIMM to which the controller makes an access.

Figure 3:
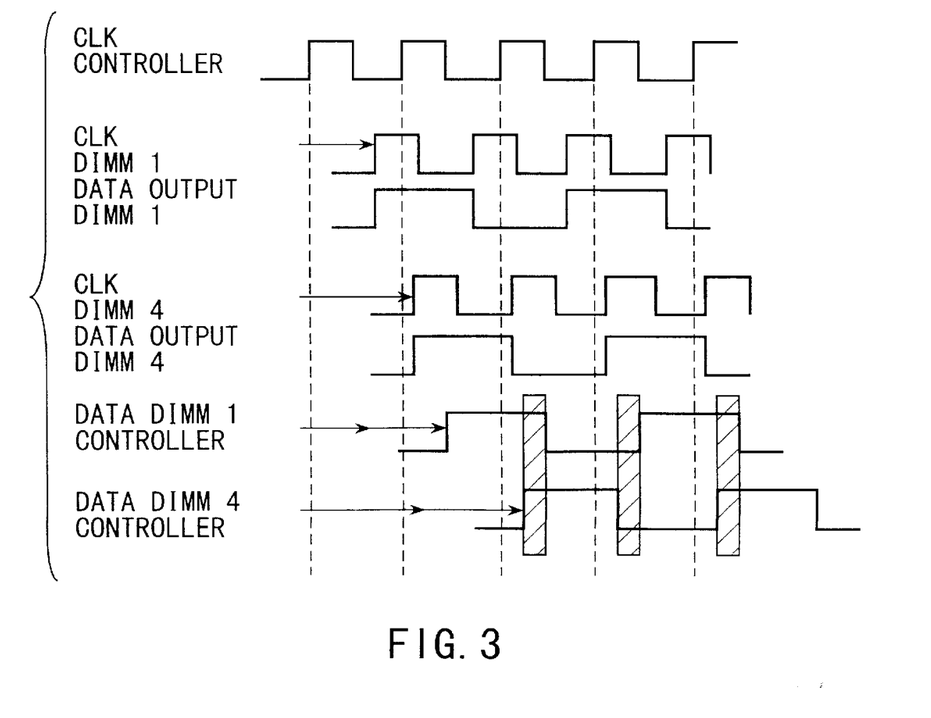
FIG. 3 is a timing chart of reading the data by the conventional memory board of FIG. 2.

This situation will be explained by using a timing chart of FIG. 3. FIG. 3 illustrates the access condition of two DIMM1 and DIMM4 shown in FIG. 2. In this case, it is assumed that each of the DIMMs alternately outputs the different data items such as "1", "0", "1", "0", . . . .

As for the controller, a leading clock that is expected to output the data and the following clock are referred to as clocks CLK. In the figure, each arrow indicates the flight time from the leading clock. In order to generate the common data fetch timing in both cases where the controller receives the data from the DIMM1 and where it receives the data from the DIMM4, a strobe signal needs to be generated during periods (data windows) in which oblique lines are drawn in the drawing. However, the data windows vary according to the condition of the board or the mounted condition of the DIMMS, and it may be often impossible to set the data windows common to the DIMMs. The method of determining the timing of the strobe signal for the data fetch, and how the timing of the strobe signal for such a data fetch should be determined and how the system which can correspond to any flight time should be produced, are important for realization of a high-speed memory board system.

BRIEF SUMMARY OF THE INVENTION

Therefore, the object of the present invention is to provide a semiconductor memory system which can easily determine the timing of the strobe signal for data fetch and which can constitute a system corresponding to any flight time, and which can thereby realize a high-speed memory board system.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiment of the present invention will be described below with reference to the drawing.

First, a constitution of a DIMM used for a semiconductor memory system of the present invention will be described with reference to FIG. 4. In the figure, the SDRAM chips on the DIMM are omitted. In the semiconductor memory system of the present invention, the SDRAMs output a clock DQS as a strobe clock together with the data. This strobe clock is used as a fetch signal when the data which is to be read from the memory is fetched. For example, each of the SDRAMs mounted on the DIMM having the 64-bit data width has an output terminal of the clock DQS, and the DIMM has totally four output terminals of the clocks DQS. The DIMM also has four terminals for the clocks CLK to be input when the data is read from the SDRAMS. Therefore, the number of the data bit length which one clock CLK and the return clock DQS have is 16.

Figure 4:
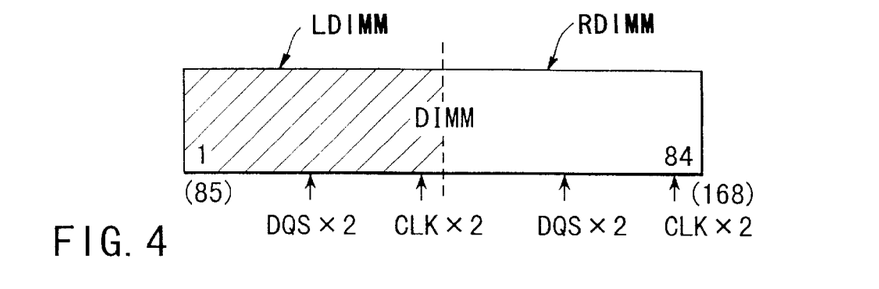
FIG. 4 is a block diagram illustrating a constitution of a DIMM used for a semiconductor memory system of the present invention.

In FIG. 4, a number of terminals are provided on both surfaces of the board. The figure illustrates totally hundred sixty eight terminals including eighty four terminals having terminal numbers 1–84 on one surface and eighty four terminals having terminal numbers 85–168 on the other surface. Each two terminals are used for the clocks CLK and strobe clocks DQS, in the left half part LDIMM where oblique lines are drawn. Similarly, each two terminals are used for the clocks CLK and strobe clocks DQS, in the right half part RDIMM where no oblique lines are drawn.

FIGS. 5 to 8 are plan views illustrating various constitutions of SDRAMs, and various DIMMs constituted by using the chips having the constitutions. In the figures, each region surrounded by a one-dot chained line is equivalent to the left half part LDIMM where oblique lines are drawn, of the DIMM shown in FIG. 4.

Figure 5:
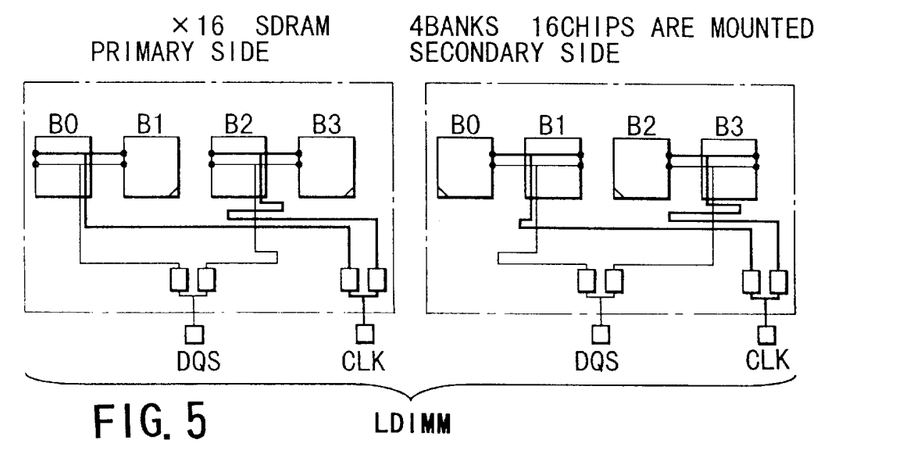
FIG. 5 is a plan view illustrating a DIMM constructed by using an SDRAM chip.

The 16-bit (×16) DIMM shown in FIG. 5 corresponds to the half part of the DIMM shown in FIG. 4. A side of the board is called a primary side and the other side thereof is called a secondary side. As shown in FIG. 5, four SDRAM chips are mounted at the primary side, and four SDRAM chips are also mounted at the secondary side. That is, eight SDRAM chips are mounted at both sides in the left half part LDIMM. Therefore, totally sixteen ×16 (parallel 16-bit) SDRAM chips are mounted at both sides of the board in the DIMM. For this reason, the data may be exchanged with only four chips simultaneously to realize the 64-bit data width of the DIMM, and therefore, the DIMM is constituted by totally four banks. The SDRAM chips assigned to the respective banks are denoted by B0, B1, B2 and B3. Each bank is constituted by four chips, and one terminal for CLK and one terminal for DQS of each chip are connected commonly as shown in the figure. The bank is here an assembly of SDRAM chips that realize a data width of 64 bits.

Figure 6:
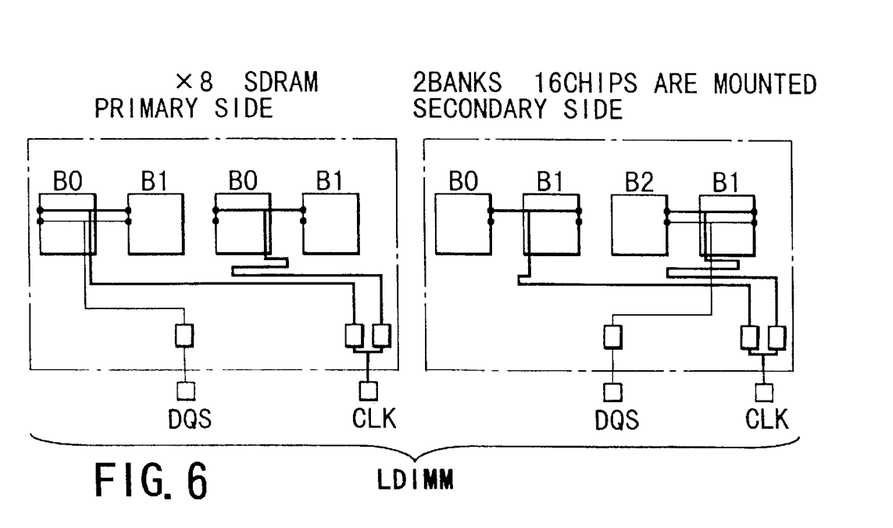
FIG. 6 is a plan view illustrating a DIMM constructed by using an SDRAM chip.

An 8-bit (×8) DIMM shown in FIG. 6 corresponds to the half part of the DIMM shown in FIG. 4. A side of the board is also called a primary side and the other side thereof is also called a secondary side. As shown in FIG. 6, four SDRAM chips are mounted at the primary side, and four SDRAM chips are also mounted at the secondary side. That is, eight SDRAM chips are mounted at both sides in the left half part LDIMM. Therefore, totally sixteen ×8 (parallel 8-bit) SDRAM chips are mounted at both sides of the board in the DIMM. For this reason, the data may be exchanged with only eight chips simultaneously to realize the 64-bit data width of the DIMM, and therefore, the DIMM is constituted by totally two banks. The chips assigned to the respective banks are denoted by B0 and B1. As shown in the figure, one terminal for CLK is connected to four chips and one terminal for DQS is connected to two chips.

Figure 7:
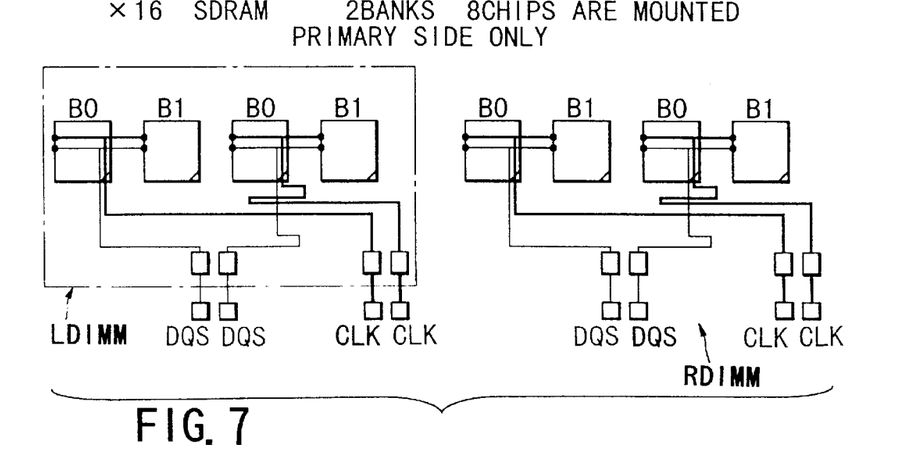
FIG. 7 is a plan view illustrating a DIMM constructed by using an SDRAM chip.

A 16-bit (×16) DIMM shown in FIG. 7 corresponds to the entire body of the DIMM shown in FIG. 4. A side of the board is also called a primary side and the other side thereof is also called a secondary side. As shown in FIG. 7, eight chips are mounted at the only primary side.

In this example, since totally eight ×16 SDRAM chips are mounted, the data may be exchanged with only four chips simultaneously to realize the 64-bit data width of the DIMM, and therefore, the DIMM is constituted by totally two banks. The chips assigned to the respective banks are denoted by B0 and B1. One terminal for CLK and one terminal for DQS are commonly connected as shown in the figure, on two chips each constituting two banks.

Figure 8:
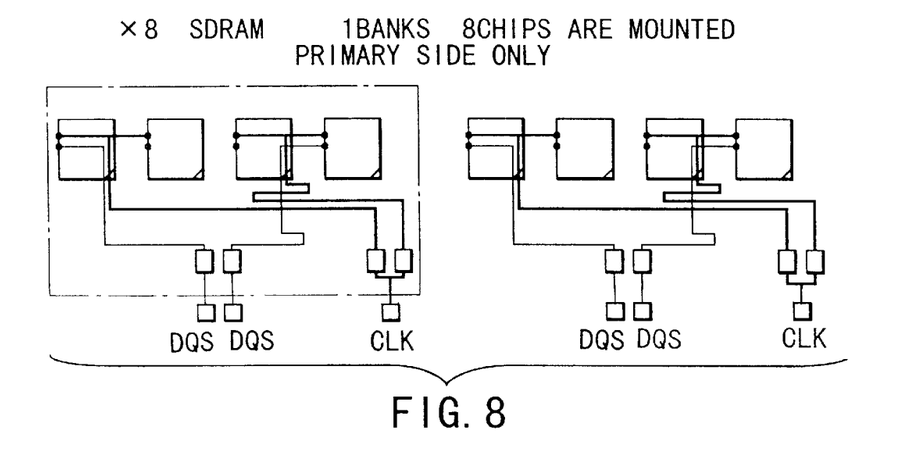
FIG. 8 is a plan view illustrating a DIMM constructed by using an SDRAM chip.

An 8-bit (×8) DIMM shown in FIG. 8 corresponds to the entire body of the DIMM shown in FIG. 4. A side of the board is also called a primary side and the other side thereof is also called a secondary side. As shown in FIG. 8, eight chips are mounted at the only primary side.

In this example, since totally eight ×8 SDRAM chips are mounted, the data may be exchanged with all the chips simultaneously to realize the 64-bit data width of the DIMM, and therefore, the DIMM is constituted entirely by one bank. The figure shows that one terminal for CLK is connected commonly to four chips, i.e. only two terminals for CLK are used on the entire DIMM and two remaining terminals (not shown) are not connected to the chips. One terminal for DQS is connected to the only one chip as shown in the figure.

On any DIMM described above, one strobe clock DQS is assigned to the 16-bit data width that is to be read from the DIMM, and one strobe clock DQS is output from the DIMM together with the data of 16-bit length that is to be read from the DIMM.

According to the present invention, in a system where the strobe clock DQS returns from each of the DIMMs to the controller together with the data, the strobe clock DQS is used as a signal for determining the timing at which the controller fetches the data.

Figure 9:
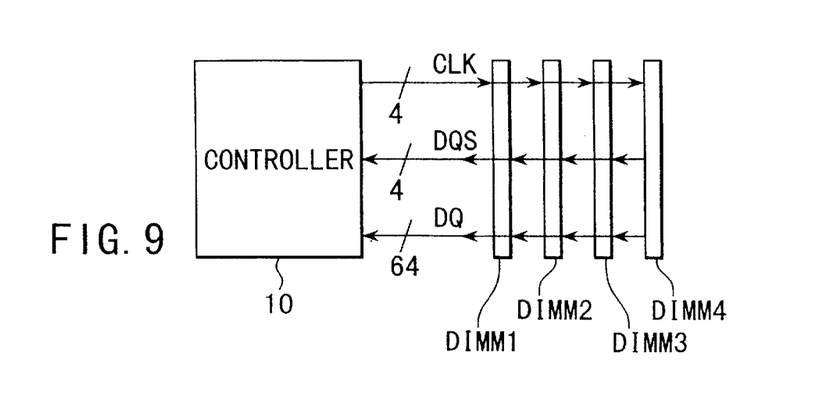
FIG. 9 is a block diagram illustrating an entire configuration of an embodiment of a semiconductor memory system according to the present invention.

FIG. 9 is a block diagram illustrating an entire configuration of an embodiment of a semiconductor memory system according to the present invention. This semiconductor memory system is constituted by a controller 10 and a plurality of DIMMs (four DIMMs, i.e. DIMM1 to DIMM4 in this embodiment) as shown in the figure. The controller 10 outputs the four clocks CLK to each of the DIMMs at the accessing time. Each DIMM reads the data synchronously with the clocks CLK. From each DIMM, the data DQ and the four strobe clock DQS return to the controller 10.

Figure 10:
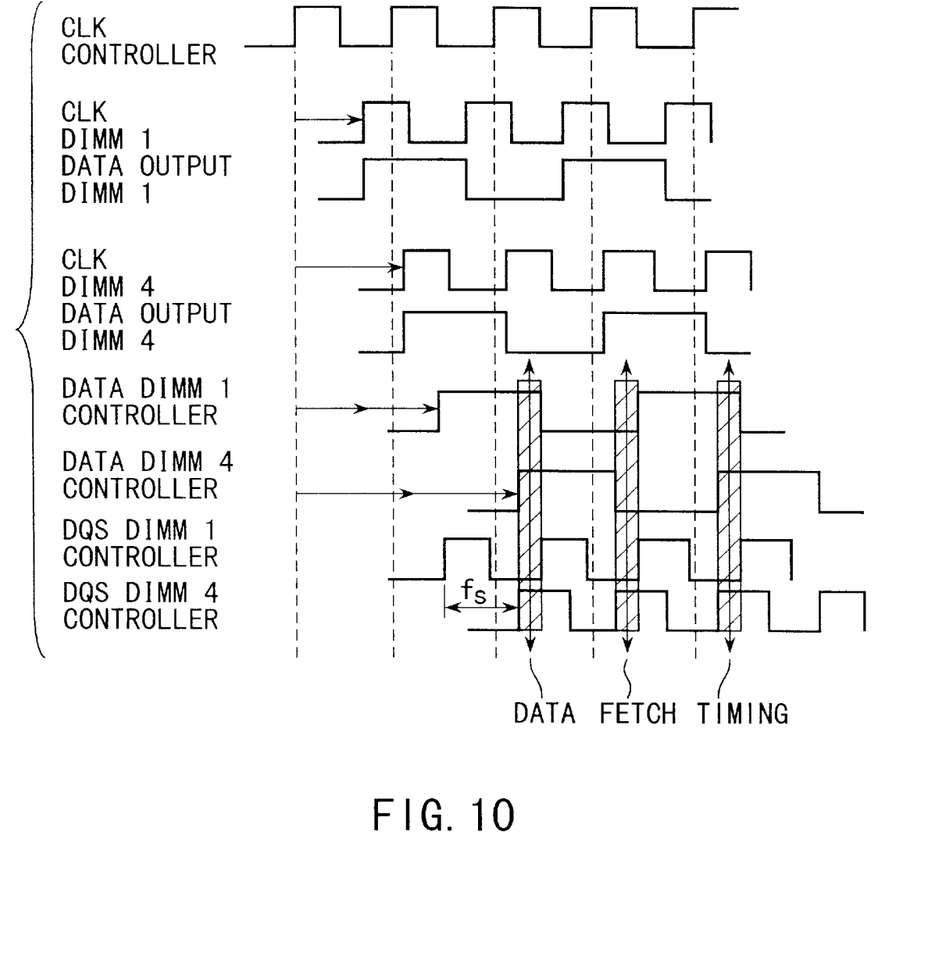
FIG. 10 is a timing chart of reading the data by the semiconductor memory system of FIG. 9.

FIG. 10 is a timing chart of reading the data by the semiconductor memory system shown in FIG. 9. The figure only illustrates the relationship in timing between two DIMMs, i.e. DIMM1 and DIMM4, for convenience of the explanations.

Receiving the clock CLK (DIMM1), the DIMM1 outputs the data DQ and simultaneously outputs the strobe clock DQS synchronously with the clock CLK.

The DIMM4 receives the clock CLK (DIMM4), and outputs the data DQ and simultaneously outputs the strobe clock DQS, with delay from the DIMM1.

The data DQ and strobe clock DQS that the controller 10 receives are shown at the lower part of FIG. 10. The strobe clock DQS is synchronized with the data DQ and, therefore, the timing of generating the strobe signal for the data fetch can be set by measuring the delay time from the clock CLK of the access request of the controller 10 to the strobe clock DQS. However, since the strobe clock DQS that the controller 10 receives has skew caused by the flight time between the DIMMS, a strobe signal must be generated after a time represented by fs in the figure. That is, if the data is fetched immediately after the strobe clock DQS returning from the DIMM at the latest time, the data can be surely fetched at the access to any DIMM. That is, a strobe signal only needs to be generated at the timing represented by broken lines in the figure. However, a strobe signal must be generated exactly in a very short time, and it is difficult to generate the fetch timing by using at a real time the strobe clock DQS returning together with the data.

Figure 11:
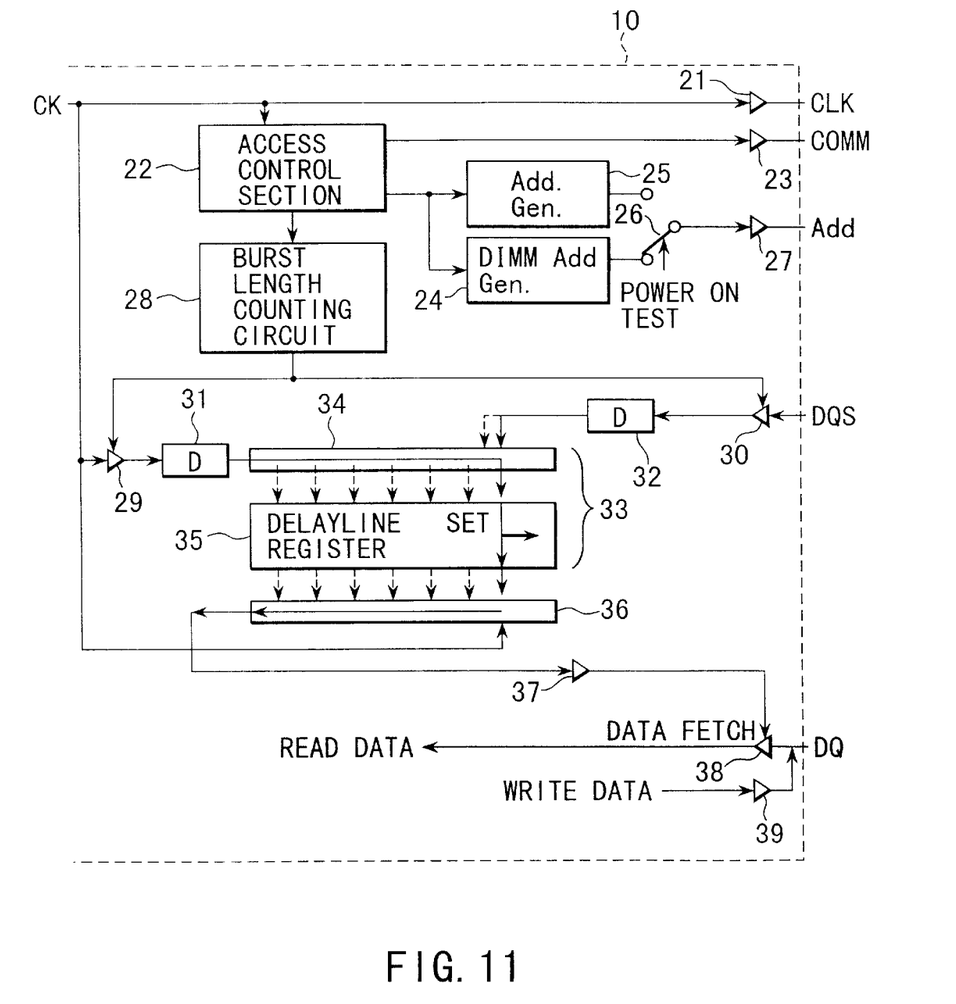
FIG. 11 is a circuit diagram illustrating a control circuit provided in the controller of FIG. 9.

For this reason, it is necessary to exactly generate the timing inside the controller, by using the strobe clock DQS as a signal for measurement of the flight time. FIG. 11 illustrates a configuration of a control circuit executing such control. This control circuit is provided in the controller 10 shown in FIG. 9.

In the system where memories are mounted, generally, operations (power-on tests) such as the memory test are carried out before the system is actually started up, after the power supply is turned on. It is the control circuit which makes an access from the controller to the respective DIMMs, measures the flight time of the strobe clock DQS and detects the maximum flight time, during the period of the memory test.

In FIG. 11, CK denotes a system clock on which the system operations are based. The clock CK is buffer-amplified by a buffer 21, and output to the respective DIMMs as the clock CLK for the DIMM access.

22 denotes an access control section, which designates a command COMM and also the clock CLK serving as a leading part of the access. The command COMM is buffer-amplified by a buffer 23, and output to each of the DIMMs. In addition, an address Add for address designation of the memory is generated on the basis of the signal from the access control section 22. An address signal is output from an address generating circuit (DIMM Add Gen) 24 that generates all the different DIMM addresses at the time of the power-on test. In the general operation, the address Add for address designation of the memory is output from an address generating circuit (Add Gen) 25 on the basis of the signal from the access control section 22.

The outputs of both the address generating circuits 24 and 25 are selected by a switch circuit 26 at the time of the power-on test and at the time of general operations, further buffer-amplified by a buffer 27, and output to each of the DIMMs as addresses.

The output from the access control section 22 is input into a burst length counting circuit 28. Since the burst length counting circuit 28 sets the timing of measuring the flight time, it counts, for example, the time corresponding to a period from a next cycle of the leading clock of the memory access to the burst length of the maximum data minus one cycle. As explained above, the reason why the burst length counting circuit 28 does not start counting from the cycle of the leading clock is that the measurement does not have to be started until the strobe clock DQS has just the rectangular shape of 0, 1, 0, 1, . . . . The time of the flight time measurement is counted by the burst length counting circuit 28. The operations of two control buffers 29 and 30 are controlled by the output of the burst length counting circuit 28.

Both the control buffers 29 and 30 are set in an operable state during a period in which the above time is count by the burst length counting circuit 28. When they are in an operated state, the buffer 29 buffer-amplifies the system clock CK and the buffer 30 buffer-amplifies the strobe clock DQS that is output from the memory. The outputs of the buffers 29 and 30 are input to a maximum flight time measuring circuit 33 through waveform rectifying circuits 31 and 32 having a mutually equivalent delay time D.

The maximum flight time measuring circuit 33 is constituted by a delay circuit 34 which delays the system clock CK that is input through the buffer 29 and the waveform rectifying circuit 31, and which is reset when the strobe clock DQS is input through the buffer 30 and the waveform rectifying circuit 32, and a delayline register circuit 35 which inputs a delay state of the delay circuit 34 and memorizes a delay state immediately before the resetting of the delay circuit 34.

36 denotes a delay circuit having the same configuration as the delay circuit 34. The delay circuit 36 is controlled to generate the same delay as that of the delay circuit 34 by moving the contents of the delay register circuit 35. In addition, the above system clock CK is input to the delay circuit 36 so that the delay having the same delay time as that generated by the delay circuit 34 is supplied to the system clock CK. The output of the delay circuit 36 is buffer-amplified by a buffer 37 and supplied to a control buffer 38 as a data fetch signal. When the data fetch signal is supplied to the control buffer 38, the control buffer 38 fetches read data DQ from the DIMM and takes it into the controller 10 as read data. In FIG. 11, a buffer 39 is a buffer for buffer-amplifying the write data when the data is written in the DIMM, and outputting it as the read data DQ.

In the controller having this structure, the clock CK of a notice access is transmitted in the delay circuit 34 of the maximum flight time measuring circuit 33. On the other hand, in accordance with the strobe clock DQS of this notice clock, the delay circuit 34 is reset and at the same time the state of the delay circuit 34 is set by the delayline register circuit 35. This setting operation of the delayline register circuit 35 is executed for each of the DIMMs, such that the state of transmitting the signal farthest in the delay circuit 34 is overwritten in the delayline register circuit 35. The state which is set in the delayline register circuit 35 becomes a delay state corresponding to the flight time when the flight time is spent most. This state is used in the general data access from the controller to the DIMMs.

That is, since the system clock CK is input to the DIMMs through the buffer 21 as the clock CLK and is also input to the delay circuit 36, it is output from the delay circuit 36 to be a data fetch signal after the maximum flight time delay in the delay circuit 36. At this timing, the data can be certainly fetched as shown in FIG. 10.

The setting operations of the delayline register circuit 35 may be executed continuously at the general access. This is because the delayline register circuit 35 always maintains the maximum delay state, such that even at the general access, the maximum value of the flight time based on the system conditions can be set to certainly execute the data fetch.

In the controller shown in FIG. 11, the circuit size can be relatively smaller. As understood from FIG. 10, however, irregularity of the flight time in each of the DIMMs is large, and if the skew in the figure exceeds the cycle time of the clock, the time zones represented by the oblique lines in the figure cannot be set. That is, the data fetch may not be able to be executed.

Next, another aspect of the present invention will be described. In this aspect inconvenience in the above aspect is removed.

As shown in FIG. 9, buses of the DQ and DQS which are data buses are common to all the DIMMs, and therefore, when the access time is switched among the DIMMs, a period in which no data is output to the buses in some cycles is set to avoid collision of the data or the like at the buses. Since a gap is generated at the data transmission in this period as seen from the controller side, it is a time to reduce the efficiency of the data transmission. Therefore, a system which can shorten this period as much as possible, and can certainly fetch the data while avoiding the data collision, is required. In addition, since there is the data gap cycle when the access is shifted between the DIMMs, it is possible to fetch the data by considering the flight time for each of the DIMMs.

Figure 12:
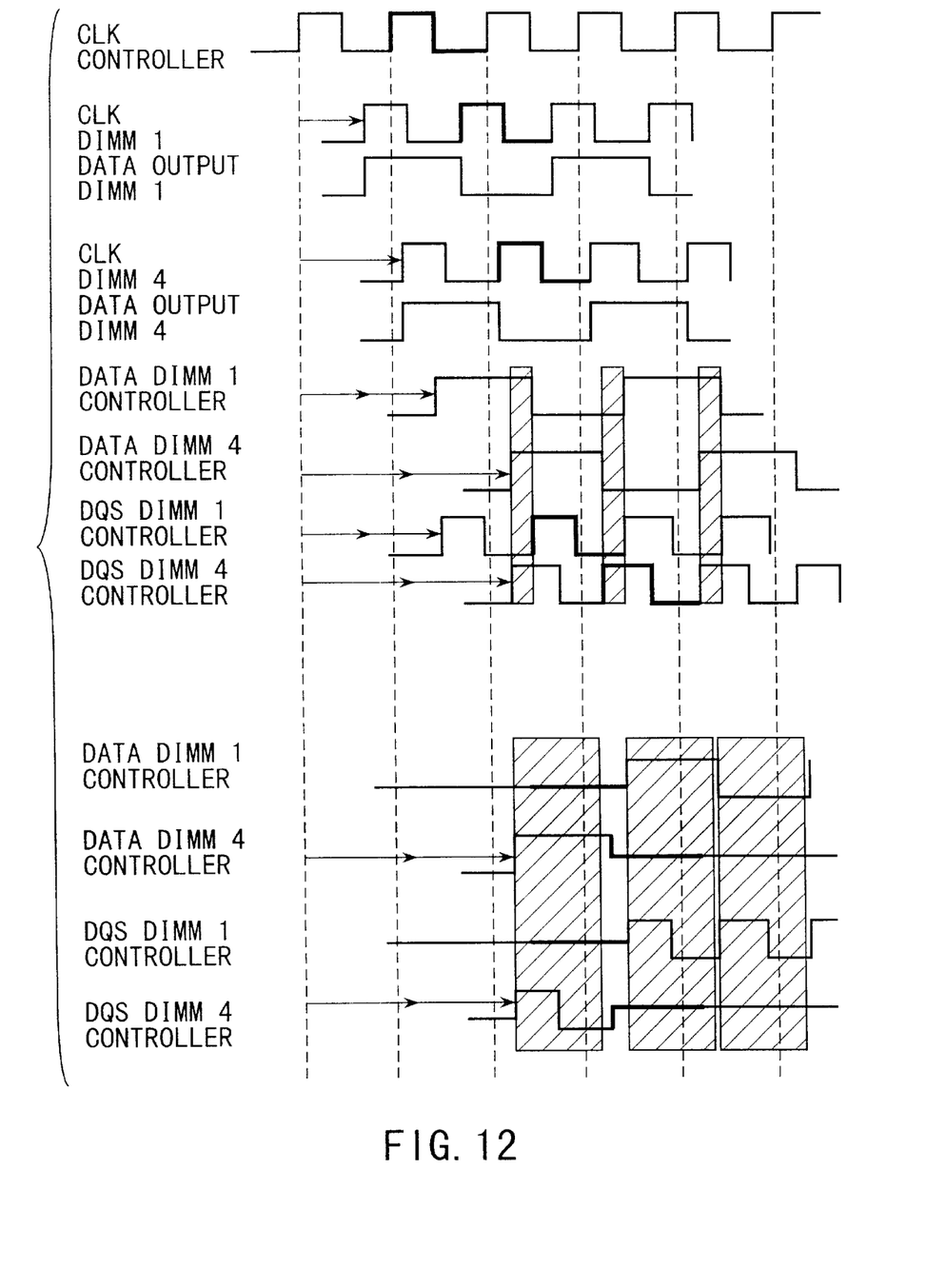
FIG. 12 is a timing chart of reading the data by another embodiment of the semiconductor memory system of the present invention.

FIG. 12 illustrates a timing chart of accessing the DIMM continuously after a one-cycle access of the DIMMs. In the figure, clock cycles drawn by bold lines are cycles in which no data is output to the buses. When the strobe clock DQS is not valid simultaneously with the data DQ output, it is set to be in the high impedance state. For this reason, the strobe clock DQS is varied from the intermediate state to "1" at the leading cycle of the data access, and this leading cycle cannot be used as a signal used to measure the flight time. However, the gap cycle at the switching operation of the DIMMs can be made minimum by varying the strobe clock DQS in this manner. In order to generate a strobe clock DQS that varies from the leading cycle to "0" to "1", the strobe clock DQS needs to be "0", i.e. in a low-impedance state at a cycle before the leading cycle, for the reason that the gap cycle is increased to avoid bus collision for this cycle.

The upper part in the timing chart of FIG. 12 corresponds to FIG. 10, illustrating how the cycle in which no data is output to the buses is transmitted to each of the DIMMs and how it reflects to the data of the controller. Therefore, similarly to FIG. 10, FIG. 12 illustrates that all the DIMMs simultaneously output the data (but the figure shows the DIMM1 and DIMM4 only). In addition, similarly to FIG. 10, oblique lines are drawn in windows of the data fetch satisfying the flight times of all the DIMMs.

The lower part of the timing chart in FIG. 12 illustrates a state seen from the controller. The portions represented by bold lines in the figure indicate the cycles controlled to prevent collision from occurring at the buses, and the cycles correspond to the high-impedance state of the data DQ and the strobe clock DQS. The bus states of two DIMMs should not be overlapped in the low-impedance state. The cycle of the bold line potions depends on the skew of the flight time. However, since FIG. 12 shows a case where the skew of the flight time is 1 cycle or less, the bold line portion which is set in the high-impedance state is substantially 1 cycle.

With this control, the data fetch timing can be set by considering the flight time for each DIMM, and the data fetch windows drawn by oblique lines at the lower part of FIG. 12 can be obtained. If the skew of the flight time can be denied and the timing skew between the clock CLK and the strobe clock DQS or between the strobe clock DQS and the data DQ can be denied, the cycle time can be used substantially as the data fetch window.

If the skew of the flight time is represented by δ and the clock cycle time is represented by T, the number of cycles designated as the high-impedance state, i.e. the number of clock cycles in which the data is not output from all the DIMMs will be the largest integer that does not exceed δ/T plus one cycle, in order to prevent the data DQ and the strobe clock DQS from colliding at the low impedance between different flight times.

Figure 13:
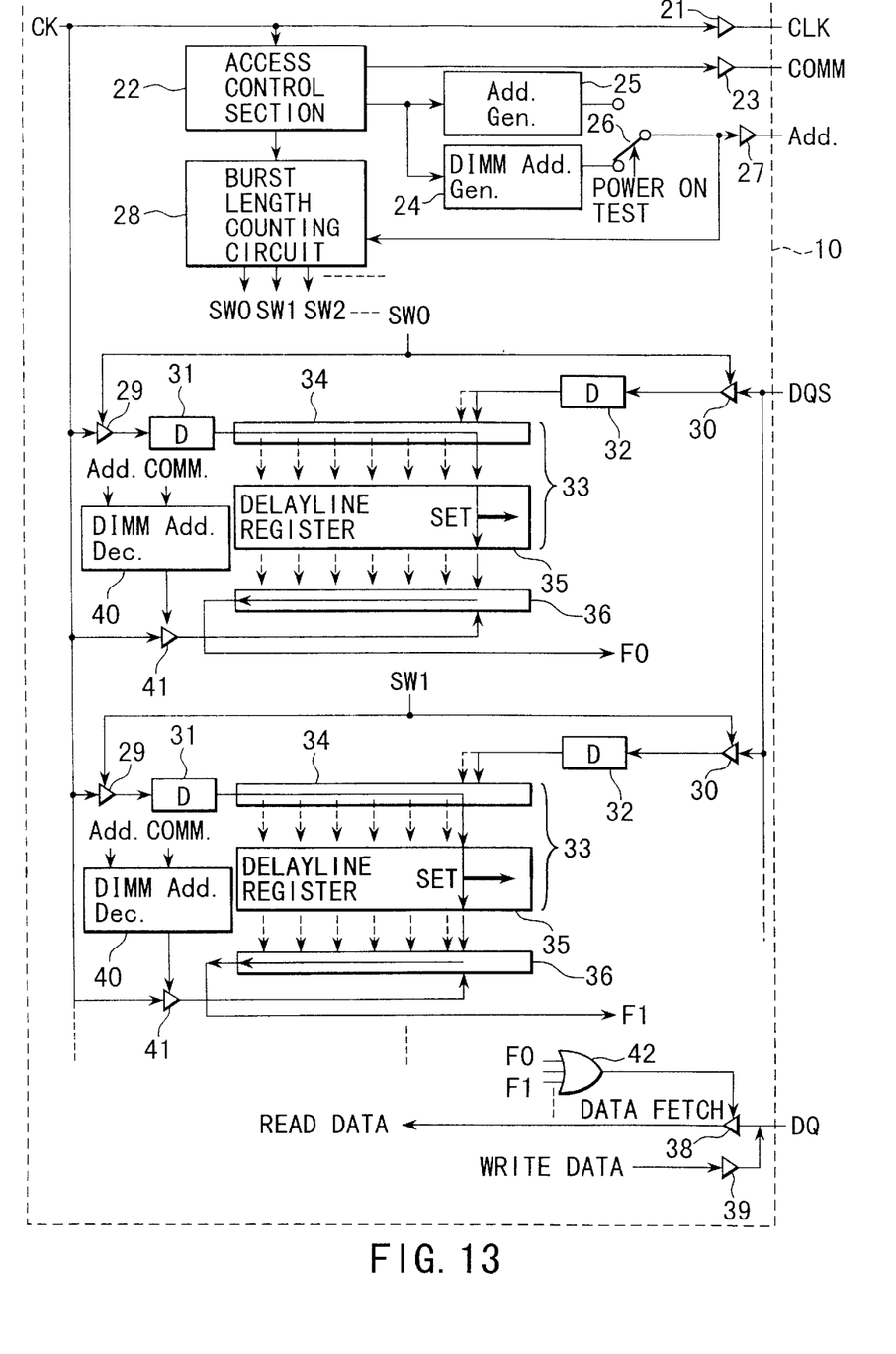
FIG. 13 is a circuit diagram illustrating a control circuit according to another embodiment of the semiconductor memory system of the present invention.

FIG. 13 illustrates a configuration of a control circuit executing the control as shown in FIG. 12.

This control circuit is provided in the controller 10 shown in FIG. 9. That is, the controller 10 shown in FIG. 13 measures the flight time and generates the data fetch timing for each DIMM or for each access block at which the signal flight time is largely varied.

In the controller 10, a circuit portion for measuring the flight time and delaying the system clock CK on the basis of the results of the measurement is provided for each DIMM, basically in the circuit shown in FIG. 11. That is, the flight time measuring circuits are provided and switched for the respective DIMMs, or for the respective access blocks in which the flight times are largely different. At the time of the power-on test, the addresses are generated to make an access to all the DIMMs, similarly to the case of FIG. 11. Therefore, the portions corresponding to FIG. 11 are denoted by the same reference numerals and their explanations are omitted, and only portions different from those of FIG. 11 will be described below.

In the controller of this aspect, switching signals SW0, SW1, SW2, . . . to switch the maximum flight time measuring circuits 33 for the respective addresses of the DIMMs, are newly generated by the burst length counting circuit 28. In addition, an address decoder (DIMM Add Dec) 40 for detecting to which DIMM an access is made, on the basis of an address Add and a command COMM to be fed to the DIMM, is provided for each address of the DIMM. Further, a control buffer 41 for allowing the delay circuit 36 to output and control the system clock CK on the basis of the output of each address decoder 40, is provided for each address of the DIMM. Outputs F0, F1, . . . of each delay circuit 36 are input to the control buffer 38 through an OR gate 42.

Moreover, the access control section 22 generates the command COMM to control so that the data output is not carried out in all the memory modules, in a cycle in which 1 is added to maximum integer that does not exceed a value obtained by dividing the time difference of flight times between the memory modules by the clock cycle time, when the accesses are switched between the memory modules.

With this configuration, the data fetch signal to fetch the data DQ that is the control signal of the control buffer 38, is generated on the basis of the maximum flight time of the flight times measured for each DIMM or for each access block in which the signal flight times are largely different.

Next, specific configurations of the major circuits employed in FIGS. 11 and 13 will be explained.

Figure 14:
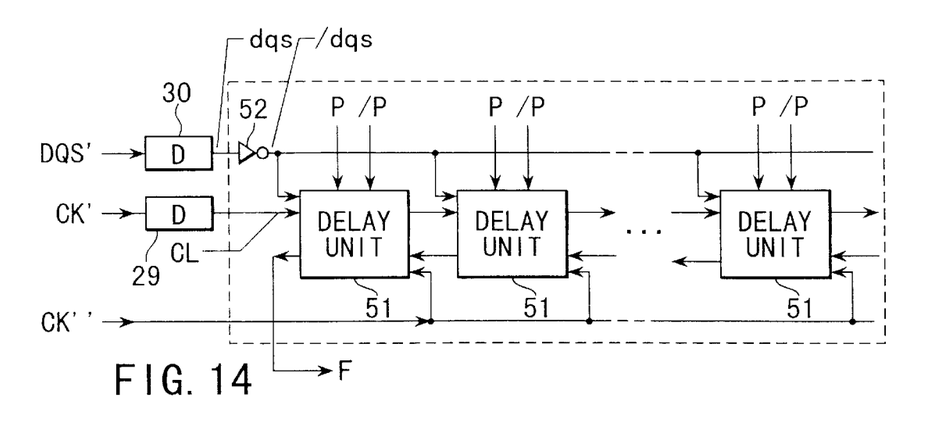
FIG. 14 is a specific block diagram illustrating a circuit including both a maximum flight time measuring circuit and a delay section in FIGS. 11 and 13.

FIG. 14 illustrates a specific configuration of a circuit including both the maximum flight time measuring circuit 33 and the delay circuit 36. A portion surrounded by a broken line in the figure corresponds to the circuits. That is, a plurality of delay units 51 are in cascade connection at multiple stages, in this circuit.

Signals DQS', CK' and CK" are switched and input from the strobe clock DQS and the system clock CK in accordance with the addresses. The signal DQS' passes through the waveform rectifying circuit 30 to be a signal dqs, and then the signal dqs is reversed at an inverter 52 to be a signal /dqs. This signal /dqs is input to the delay units 51 of the respective stages.

The signal CK' passes through the waveform rectifying circuit 29 to be a signal CL. This signal CL is input to the initial stage of the plural delay units 51 that are in the cascade connection at multiple stages.

Figure 15:
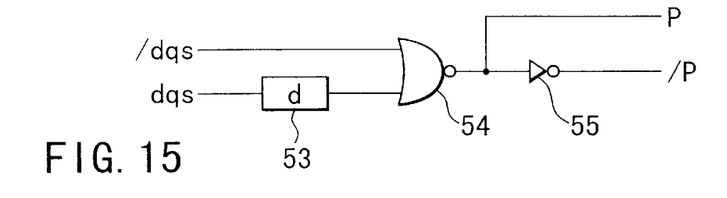
FIG. 15 is a diagram illustrating a circuit for generating a signal used in the circuit of FIG. 14.

A pair of signals P, /P are input to the delay units 51 of the respective stages. The signals P, /P generate a pulse signal having a width d when the signal dqs rises, and resets the circuit corresponding to the delay circuit 34. As shown in FIG. 15, this circuit is constituted by a delay circuit 53 of a delay time d for delaying the signal dqs, an NOR gate 54 in which the output of the delay circuit 53 and the signal /dqs are input, and an inverter 55 for reversing the output of the NOR gate 54.

Figure 16:
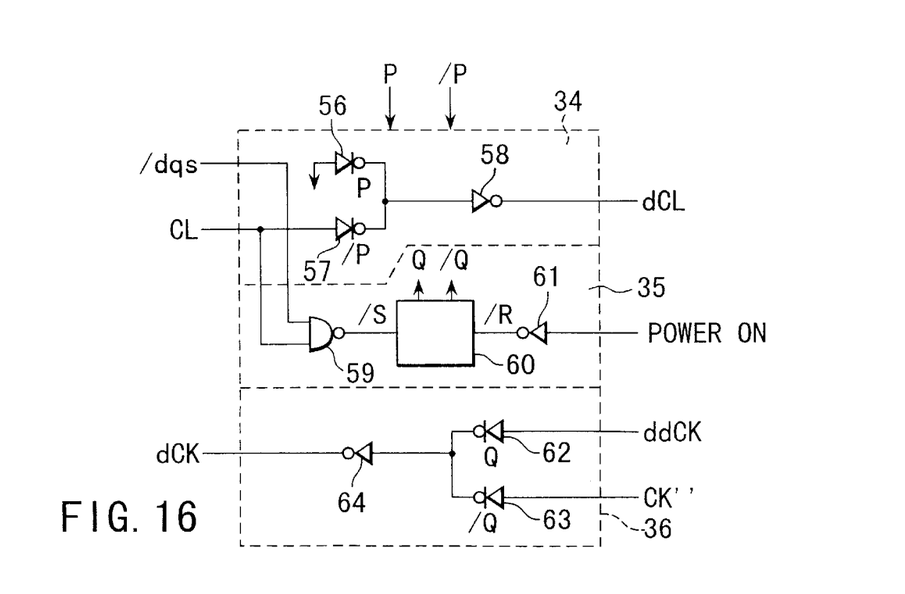
FIG. 16 is a diagram illustrating concrete circuits of the delay units of FIG. 14.

FIG. 16 illustrates concrete circuits in each of the delay units 51 shown in FIG. 14.

In the delay unit 51, two clocked inverters 56 and 57 constituting the delay circuit 34, and an inverter 58 are provided. An input terminal of the clocked inverter 56 is connected to the ground potential so that "0" is input at any time. When the signal P is 1 (i.e. when the signal /P is 0), the clocked inverter 56 is operated to reverse and output the input signal.

The signal CL is input to an input terminal of the clocked inverter 57. When the signal /P is "1" (i.e. when the signal P is "0"), the clocked inverter 57 is operated to reverse and output the signal CL. Output terminals of both the clocked inverters 56 and 57 are connected commonly to an input terminal of the inverter 58, and an output signal dCL of the inverter 58 is input to the delay unit 51 of the next stage.

A circuit comprising an NAND gate 59, a state maintaining circuit 60 and an inverter 61 is also provided to constitute the delayline register circuit 35, in the delay unit 51. The signals dqs and CL are input to the NAND gate 59, and a power-on signal PowerON is input to the inverter 61. The state maintaining circuit 60 has a set input terminal, a reset input terminal and a complementary output terminal of Q, /Q, and the output signals of the NAND gate 59 and the inverter 61 are input to the set input terminal and the reset input terminal as a set signal /S and a reset signal /R.

Further, two clocked inverters 62 and 63, and an inverter 64 constituting the delayline register circuit 36 is provided in the delay unit 51. A signal ddCK which is output from the delay unit 51 of the back stage is input to the clocked inverter 62, which is operated to reverse and output the input signal when the output signal Q of the state maintaining circuit 60 in the corresponding delay unit 51 is "1" (i.e. when the signal /Q is "0").

The signal CK" is input to the clocked inverter 63, which is operated to reverse and output the input signal when the output signal /Q of the state maintaining circuit 60 in the corresponding delay unit 51 is "1" (i.e. when the signal Q is "0"). The output terminals of the clocked inverters 62 and 63 are connected commonly to the input terminal of the inverter 64, and an output signal dCK of the inverter 64 is input to the delay unit 51 of the front stage.

In the delayline register circuit 35, when the signal /P is "1", the clocked inverter 57 is operated, the signal CL passes through the clocked inverter 57 and the inverter 58 and thereby the delayed signal dCL can be obtained. When the signal P is "1", the clocked inverter 57 becomes in a non-operated state, and instead the clocked inverter 56 becomes in an operated state. At this time, "0" has been input to the clocked inverter 56 as the input signal and the output signal of the clocked inverter 56 becomes "1", and therefore, the signal dCL becomes "0" and the clocked inverter 56 is reset.

In the delayline register circuit 35, when the signal /dqs is "1" (i.e. the signal dqs is "0") and the signal CL is "1", the set signal /S that is the output signal of the NAND gate 59 becomes "0" and the state maintaining section 60 is set. After that, even if the signal dqs rises to "1", the NAND gate 59 does not output the set signal /S.

On the other hand, when the power-on signal PowerOn is input, the reset signal /R that is the output signal of the inverter 61 becomes "0" and the state maintaining circuit 60 is reset.

In the delayline register circuit 36, when the output signal Q of the state maintaining circuit 60 is "1", the signal ddCK passes through the clocked converter 62 and the inverter 64 and the delayed signal dCK can be thereby obtained, similarly to the delayline register circuit 33. However, when the output signal /Q of the state maintaining circuit 60 is "1", the signal CK" which is input to the delay unit 51 is transmitted to the delay unit 51 of the front stage.

Figure 17:
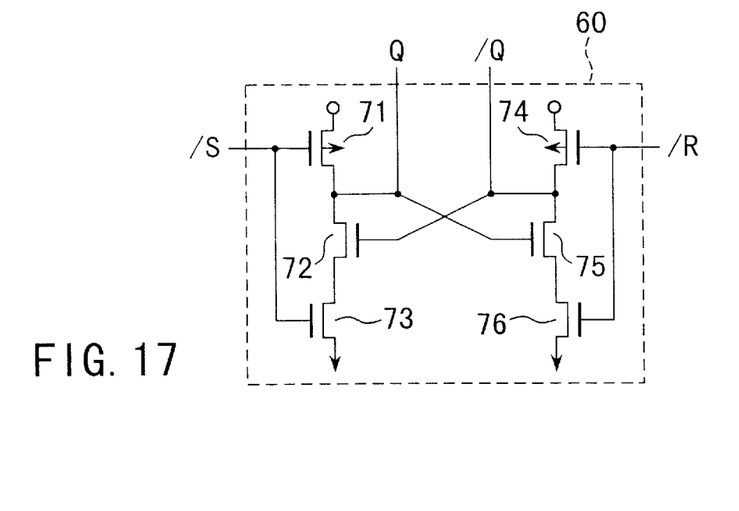
FIG. 17 is a diagram illustrating an inner configuration of a state maintaining section of FIG. 16.

FIG. 17 illustrates a detailed circuit configuration of the state maintaining circuit 60 shown in FIG. 16. This circuit is constituted by a p-channel MOS transistor 71 and n-channel MOS transistors 72, 73 in which a source and drain path is inserted between the supply node of the power supply voltage and the node of the ground voltage, and a p-channel MOS transistor 74 and n-channel MOS transistors 75, 76 in which a source and drain path is inserted between the supply node of the power supply voltage and the node of the ground voltage. The set signal /S is input to the gates of the transistors 71 and 73, the reset signal /R is input to the gates of the transistors 74 and 76, the signal of the series connection node of the transistors 71 and 72 is output as the output signal Q and input to the gate of the transistor 75, and the signal of the series connection node of the transistors 74 and 75 is output as the output signal /Q and input to the gate of the transistor 72.

The state maintaining circuit 60 having this configuration is basically a flip-flop circuit. If the reset signal /S becomes "0", the transistor 71 is turned on and the output signal Q becomes "1". At this time, the reset signal /R is "1" and the transistor 76 is turned on. When the output signal Q becomes "1", the transistor 75 is turned on and the output signal /Q becomes "0". When the reset signal /R becomes "0" in a state where the set signal /S is "1", the output signal Q becomes "0" and the output signal /Q becomes "1", which is opposite to the above case.

Figure 18:
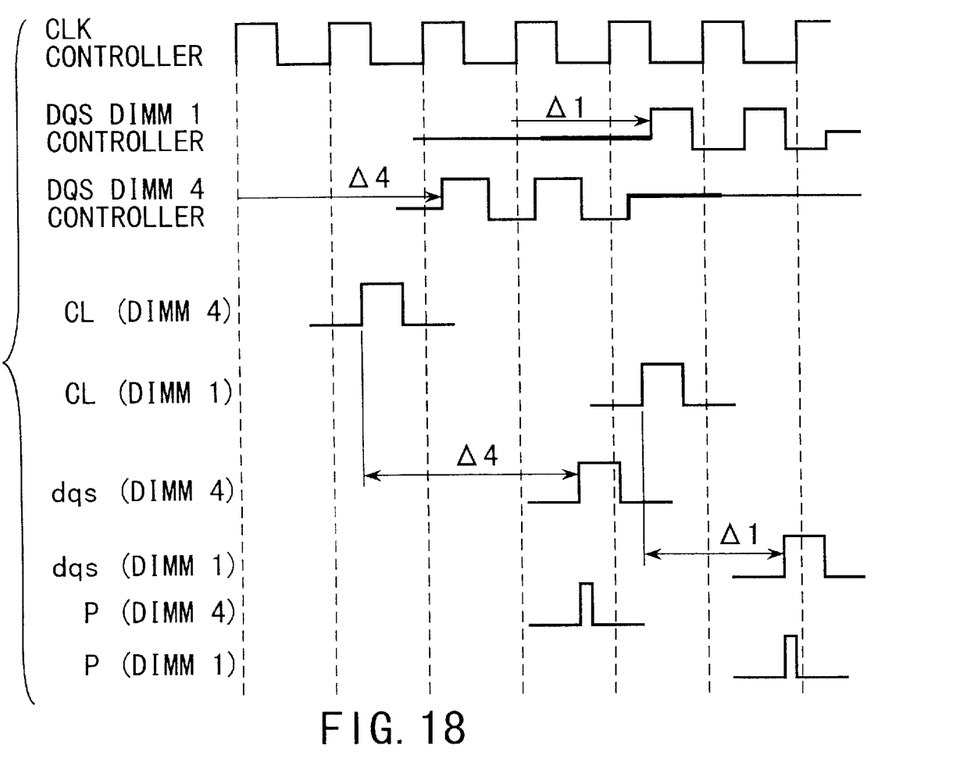
FIG. 18 is a timing chart illustrating the relationship in the timings of signals generated in the circuits of FIGS. 14 to 17.

FIG. 18 is a timing chart illustrating the relationship in the timings of the signals generated in the circuits shown in FIGS. 14 to 17. This figure shows a case where the burst length is 2. In addition, a flight time to be spent by the time when the data of the DIMM1 returns from the clock CLK is represented by Δ1, and a flight time to be spent by the time when the data of the DIMM4 returns from the clock CLK is represented by Δ4. Since the initial signal in the bust operation of the strobe clock DQS is transmitted from the intermediate level of the high impedance to "1" as described above, the transmission of the signal may be unclear, and for this reason, the transmission of the second DQS and the following ones is used. Therefore, the period for measurement of the flight time is a period from the rise of the inner clocks CL to the rise of the clocks DQS, and the delay amounts are Δ1 and Δ4. The reset signal P of the delay circuit 34 is generated as a pulse at the rise of the strobe clock DQS (dqs), so that all the output signals of the delay units 51 are 0 and the set state of the state maintaining circuit 60 does not further proceed.

In the above descriptions, the strobe clock DQS is used for measurement of the flight time. However, if inconvenience to write the data is acceptable without using the strobe clock DQS, the DQ data can be used instead of the strobe clock DQS by writing the alternate pattern of 0, 1, 0, 1, 0, 1, . . . in the DIMMs as the data and reading it therefrom.

As described above, according to the present invention, it is possible to provide a semiconductor memory system which can easily determine the timing of the strobe signal for the data fetch and constitute a system corresponding to any flight time, and can thereby realize a high-speed memory board system.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory system having memory units; and a controller for controlling said memory units, said controller accessing said memory units synchronously with a system clock and reading data from an address region where said memory units exist to input the data into said controller, and a flight time from said clock at a data output start request from the controller to a time when the data of said address region is able to be input, for an access to the data of said address region where said memory units exist, being different in different kinds of address regions, said controller comprising:

a maximum value measuring circuit for accessing data in various kinds of address regions, measuring a maximum value of said flight times, and maintaining the value as a state of a register, during a period before making a series of accesses to data maintained in said memory units; and a timing signal generating circuit for delaying the clock of the data output start by a time corresponding to the maximum time of said flight times and generating a timing signal for data input, on the basis of the state of the register measured and maintained by said maximum value measuring circuit, for the series of data accesses after said period has been terminated.

2. A semiconductor memory system according to claim 1, further comprising a data input circuit for inputting the read data from said memory units synchronously with the timing signal generated by said timing signal generating circuit.

3. A semiconductor memory system according to claim 1, wherein said memory units are memory modules having a plurality of memory chips.

4. A semiconductor memory system according to claim 1, wherein said maximum value measuring circuit measures a flight time at every series of accesses after said test period has been terminated, and the state of said register is renewed on the basis of the maximum value of the measured flight times.

5. A semiconductor memory system according to claim 1, wherein said maximum value measuring circuit measures the maximum value of said flight time by using a control signal which said memory units output synchronously with the data output.

6. A semiconductor memory system according to claim 5, wherein said control signal is a clock.

7. A semiconductor memory system according to claim 1, wherein said maximum value measuring circuit comprises a first delay circuit for transmitting the system clock and a register circuit for storing the state of said system clock passing through said first delay circuit in response to the output of the delay circuit at that portion; and said timing signal generating circuit has a second delay circuit to which said system clock is supplied and in which a delay time is set in response to the memory contents of said register circuit.

8. A semiconductor memory system according to claim 1, wherein said period is a test period.

9. A semiconductor memory system having memory units; and a controller for controlling said memory units, said controller accessing said memory units synchronously with a system clock and reading data from an address region where said memory units exist to input the data into said controller, and a flight time from said clock at a data output start request from the controller to a time when the data of said address region is able to be input, for an access to the data of said address region where said memory units exist, being different in groups of said address regions, said controller comprising:

a plurality of maximum value measuring circuits for accessing data in various kinds of address regions in each of said groups, measuring a maximum value of said flight times, and maintaining the value as a state of a register, during a period before making a series of accesses to data maintained in said memory units; and a timing signal generating circuit for delaying the clock of the data output start request from the controller by a time corresponding to the maximum time of said flight times and generating a timing signal for data input, on the basis of the state of the register holding the flight time of the maximum value, of the registers of said plurality of maximum value measuring circuits, for the series of data accesses after said period has been terminated.

10. A semiconductor memory system according to claim 9, further comprising data input circuit for inputting the read data from said memory units, synchronously with the timing signal generated by said timing signal generating circuit.

11. A semiconductor memory system according to claim 9, wherein said memory units are memory modules having a plurality of memory chips.

12. A semiconductor memory system according to claim 9, further comprising control circuit for controlling not to execute data output in all the memory modules, during a cycle obtained by adding 1 to maximum integer that does not exceed a value obtained by dividing a flight time difference between said memory modules by a clock cycle time, when the accesses are switched between said memory modules.

13. A semiconductor memory system according to claim 9, wherein said maximum value measuring circuit comprises a first delay circuit for transmitting the system clock and a register circuit for storing the state of said system clock passing through said first delay circuit in response to the output of the delay circuit at that portion; and said timing signal generating circuit has a second delay circuit to which said system clock is supplied and in which a delay time is set in response to the memory contents of said register circuit.

14. A semiconductor memory system according to claim 9, wherein said period is a test period.

15. A semiconductor memory system according to claim 14, wherein said plurality of maximum value measuring circuits measure a flight time for each of said groups at every series of accesses after said test period has been terminated, and the state of each of said registers is renewed on the basis of the maximum value of the measured flight times for each of said groups.

16. A semiconductor memory system comprising:

memory units;

a clock output circuit for outputting a first clock to said memory units, during a period before starting a series of accesses to data maintained in said memory units;

a first delay circuit for delaying said first clock, and being reset synchronously with data output from said memory units receiving said first clock, after receiving a second clock to be output from said memory clocks;

a storage circuit for storing a delayed state immediately before resetting said first delay circuit; and a second delay circuit to which said first clock is supplied and in which a delay time is set in response to the stored contents of said storage circuit.

17. A semiconductor memory system according to claim 16, further comprising a data input circuit for inputting read data from said memory units synchronously with an output of said second delay circuit.

18. A semiconductor memory system according to claim 16, wherein said period is a test period.

19. A semiconductor memory system according to claim 18, wherein said clock output circuit outputs said first clock to said memory units for each of the series of accesses after said test period has been terminated.

20. A method of operating a semiconductor memory system having memory units and a controller for controlling said memory units, comprising the steps of:

supplying various addresses sequentially and supplying a first clock from said controller to said memory units and accessing said memory units, during a test period before a series of accesses to data maintained in said memory units are started;

measuring a maximum value of a period from the time when an output of said first clock is output until the time when a second clock is output from said memory units synchronously with read of data from said memory units; and fetching the data which is read from said memory units, in accordance with a signal which delays said first clock by said measured period.

21. A method of operating a semiconductor memory system, according to claim 20, further comprising the steps of:

supplying a prescribed address and said first clock from said controller to said memory units and accessing said memory units, at the series of accesses after said test period has been terminated;

measuring a maximum value of a period from the time when an output of said first clock is output until the time when a second clock is output from said memory units synchronously with read of data from said memory units; and fetching the data which is read from said memory units, in accordance with a signal which delays said first clock by said measured period.

* * * * *